United States Patent [19]
Song

[11] Patent Number: 5,841,811
[45] Date of Patent: Nov. 24, 1998

[54] QUADRATURE SAMPLING SYSTEM AND HYBRID EQUALIZER

[75] Inventor: William S. Song, Lexington, Mass.

[73] Assignee: Massachusetts Institute of Technology, Cambridge, Mass.

[21] Appl. No.: 599,554

[22] Filed: Feb. 28, 1996

Related U.S. Application Data

[63] Continuation of Ser. No. 320,164, Oct. 7, 1994, abandoned.

[51] Int. Cl.[6] .............................. H03H 7/30; H03H 7/40; H03K 5/159
[52] U.S. Cl. .......................... 375/235; 375/340; 375/350
[58] Field of Search ..................................... 375/235, 261, 375/340, 349, 350; 348/398; 329/304, 306, 345, 346

[56] References Cited

U.S. PATENT DOCUMENTS

| | | |
|---|---|---|
| 4,691,176 | 9/1987 | Hsiung et al. . |
| 4,779,054 | 10/1988 | Monteleone et al. . |
| 4,821,294 | 4/1989 | Thomas, Jr. . |
| 4,910,467 | 3/1990 | Leitch . |
| 4,922,506 | 5/1990 | McCallister et al. . |
| 4,975,927 | 12/1990 | Yoshida .................................. 375/235 |
| 5,081,521 | 1/1992 | Faroudja . |
| 5,111,202 | 5/1992 | Rivera et al. . |
| 5,200,978 | 4/1993 | Lo Curto et al. ........................ 375/235 |
| 5,298,908 | 3/1994 | Piele . |

FOREIGN PATENT DOCUMENTS

0445335 A1  9/1991  European Pat. Off. .

OTHER PUBLICATIONS

Bellanger, Maurice G., Georges Bonnerot and Michel Coudreuse, "Digital Filtering by Polyphase Network: Application to Sample–Rate Alteration and Filter Banks", *IEEE Transactions on Acoustics, Speech and Signal Processing*, vol. ASSP–24, No. 2, Apr. 1976, pp. 109–114.

Brown, Jr., J.L., "On Quadrature Sampling of Bandpass Signals", *IEEE Transactions on Aerospace and Electronic Systems*, vol. AES–15, No. 3, May 1979, pp. 366–371.

Considine, V., "Digital Complex Sampling", *Electronics Letters*, Aug. 4, 1983, vol. 19, No. 16, pp. 608–609.

Grace, O.D., and S.P. Pitt, "Quadrature Sampling of High–Frequency Waveforms", *The Journal of the Acoustical Society of America*, vol. 44, No. 5, 1968, pp. 1453–1454.

Horiguchi, Toshio, "A Full Digital Phase Delay Compensation Beam–Forming Scheme for Ultrasonic Imaging Using Arrays", *NEC Res. & Develop.*, No. 88, Jan. 1988, pp. 47–56.

(List continued on next page.)

*Primary Examiner*—Stephen Chin
*Assistant Examiner*—Don Vo
*Attorney, Agent, or Firm*—Samuels, Gauthier, Stevens & Reppert

[57] ABSTRACT

A quadrature sampling system and method (BQS) and a hybrid quadrature sampling and channel equalization system and method (BQS/EQ) which convert input signals to baseband inphase and quadrature signal components. The BQS system includes an inphase signal channel including a first set of K filters, and a signal summer which sums the outputs of the first set of K filters to produce the inphase signal component; a quadrature signal channel including a second set of K filters, and a signal summer which sums the outputs of the second set of K filters to produce the quadrature signal component; and a controlled switch which provides input samples to the inphase and quadrature signal channels so that each filter of both channels receives one input sample of each sequence. The BQS/EQ system includes first and second sets of signal processing filter pairs, each pair including an inphase and a quadrature filter. A controlled switch alternately switches input samples between the first and second sets of signal processing filter pairs and applies selected ones of the input samples to each filter pair so that each filter pair receives one input sample of each sequence. The outputs of the filters pairs of each set are selectively provided to the inphase and quadrature signal summers.

13 Claims, 7 Drawing Sheets

OTHER PUBLICATIONS

Liu, Hulin, Arif Ghafoor and Peter H. Stockmann, "A New Quadrature Sampling and Processing Approach", *IEEE Transactions on Aerospace and Electronic Systems*, vol. 25, No. 5, Sep. 1989, pp. 733–748.

Lu, Chung H., "Polyphase FIR Filters for the Demodulation of Chrominance Signals", *IEEE ISCAS*, 1988, pp. 2313–2316.

Marino, José B. and Enrique Masgrau, "Sampling In–Phase and Quadrature Components of Band–Pass Signals", *Signal Processing*, vol. 20, No. 2, Jun. 1990, pp. 121–125 & cover page.

Pellon, Leopold E., "A Double Nyquist Digital Product Detector for Quadrature Sampling", *IEEE Transactions on Signal Processing*, vol. 40, No. 7, Jul. 1992, pp. 1670–1681.

Rader, Charles M., "A Simple Method for Sampling In–Phase and Quadrature Components", *IEEE Transactions on Aerospace and Electronic Systems*, vol. AES–20, No. 6, Nov. 1984, pp. 821–824.

Rice, D.W. and K.H. Wu, "Quadrature Sampling With High Dynamic Range", *IEEE Transactions on Aerospace and Electronic Systems*, vol. AES–18, No. 4, Nov. 1982, pp. 736–739.

Sadr, Ramin and William J. Hurd, "Digital Carrier Demodulation for the DSN Advanced Receiver", *TDA Progress Report*, Jet Propulsion Lab. & NASA Case No. NPO–17628, Jan.–Mar. 1988, pp. 1a–16a, pp. i–ii, & table of contents pp. 1–2.

Saulnier, Gary J., Charles McD. Puckette, IV, Richard C. Gaus, Jr., Robert J. Dunki–Jacobs and Timothy E. Thiel, "A VLSI Demodulator for Digital RF Network Applications: Theory and Results", *IEEE Journal on Selected Areas in Communications*, vol. 8, No. 8, Oct. 1990, pp. 1500–1511.

Teitelbaum, Kenneth, "A Flexible Processor for a Digital Adaptive Array Radar", *Proceedings of the 1991 IEEE National Radar Conference*, Los Angeles, CA, Mar. 12–13, 1991, pp. 103–107, & Briefing on Group 49 Processor, cover & p. 2.

Thomas, J.B., B. Rayhrer and L.E. Young, "Sampling Downconverter for Radio–Frequency Signals", *NASA Jet Propulsion Laboratory Progress Report*, JPL & NASA Case No. NPO–17530, pp. i, 1, 1a–16a.

Waters, W.M. and B.R. Jarrett, "Bandpass Signal Sampling and Coherent Detection", *IEEE Transactions on Aerospace and Electronic Systems*, vol. AES–18, No. 4, Nov. 1982, pp. 731–736.

Webb, Richard C., "If Signal Sampling Improves Receiver Detection Accuracy", *Microwaves & RF*, Mar. 1989, pp. 99–103.

QUADRATURE SAMPLING SYSTEM AND HYBRID EQUALIZER

This is a continuation of application Ser. No. 08/320,164 filed on Oct. 7, 1994 now abandoned.

This invention was made with government support under Contract No. F19628-90-C-0002 awarded by the Air Force. The government has certain rights in the invention.

BACKGROUND OF THE INVENTION

In many coherent sonar, radar, and communication applications, it is useful for the receiver outputs to be converted to baseband inphase and quadrature (denoted by I and Q) signal components. This process is referred to as quadrature sampling. When the application uses Digital Signal Processing (DSP), the I and Q signals are converted to digital signals by analog to digital (A/D) converters.

FIG. 1 shows a conventional analog quadrature sampler 10. The intermediate frequency (IF) input centered around the carrier frequency $f_c$ is mixed down to baseband via mixers 11, 12 by $\cos 2\pi f_c t$ and $\sin 2\pi f_c t$ local oscillator signals. The results are lowpass filtered by filters 13, 14 to eliminate the image signal generated while mixing, and then are passed to A/D converters 15, 16 to produce digital baseband I and Q signals.

SUMMARY OF THE INVENTION

It is an object of the present invention to provide a digital baseband quadrature sampling (BQS) system, which is configured with finite impulse response (FIR) filters.

It is another object of the present invention to provide efficient BQS module architecture, which has half the computational requirement of the conventional architectures.

It is yet another object of the present invention to provide a new hybrid filter architecture, which combines the BQS and EQ filter into one hybrid filter, and which is far more efficient than the conventional hybrid filter architectures.

According to one embodiment of the present invention there is provided a quadrature sampling system and method which converts input signals to baseband inphase and quadrature signal components. The system includes circuitry which receives the input signal having a frequency centered around a predetermined carrier frequency. A signal processor such as an analog to digital converter continuously samples the input signal at a carrier frequency which is centered around a selected ratio, for example (2N+1)/4, of the sampling rate to produce discrete sequences of 2K input samples. An inphase signal channel includes a first set of K filters each having respective filter coefficients, and a signal summer which sums the outputs of the first set of K filters to produce the inphase signal component. A quadrature signal channel includes a second set of K filters each having respective filter coefficients, and a signal summer which sums the outputs of the second set of K filters to produce the quadrature signal component. The input samples are provided to the inphase and quadrature signal channels so that each filter of both channels receives one input sample of each sequence.

According to another embodiment of the present invention there is provided a hybrid quadrature sampling and channel equalization system and method which converts input signals to equalized baseband inphase and quadrature signal components. The system includes circuitry which receives the input signal having a frequency centered around a predetermined carrier frequency. A signal processor such as an analog to digital converter continuously samples the input signal at a carrier frequency which is centered around a selected ration, for instance (2N+1)/4, of the sampling rate to produce discrete sequences of 2K digital input samples. There is provided first and second sets of signal processing filter pairs each including an inphase filter having an inphase filter coefficient and a quadrature filter having a quadrature filter coefficient. The input samples are alternately switched between the first and second sets of signal processing filter pairs and selected ones of the input samples are applied to each filter pair so that each filter pair receives one digital input sample of each sequence. An inphase signal summer is operable for summing the outputs of selected filters from each of the signal processing filter sets to produce the inphase signal component. A quadrature signal summer is operable for summing the outputs of selected filters from each of the signal processing filter sets to produce the inphase signal component. The outputs of the filters pairs of each set are selectively provided to the inphase and quadrature signal summers.

BRIEF DESCRIPTION OF THE ILLUSTRATED EMBODIMENTS

DETAILED DESCRIPTION OF THE ILLUSTRATED EMBODIMENTS

Figure 2:
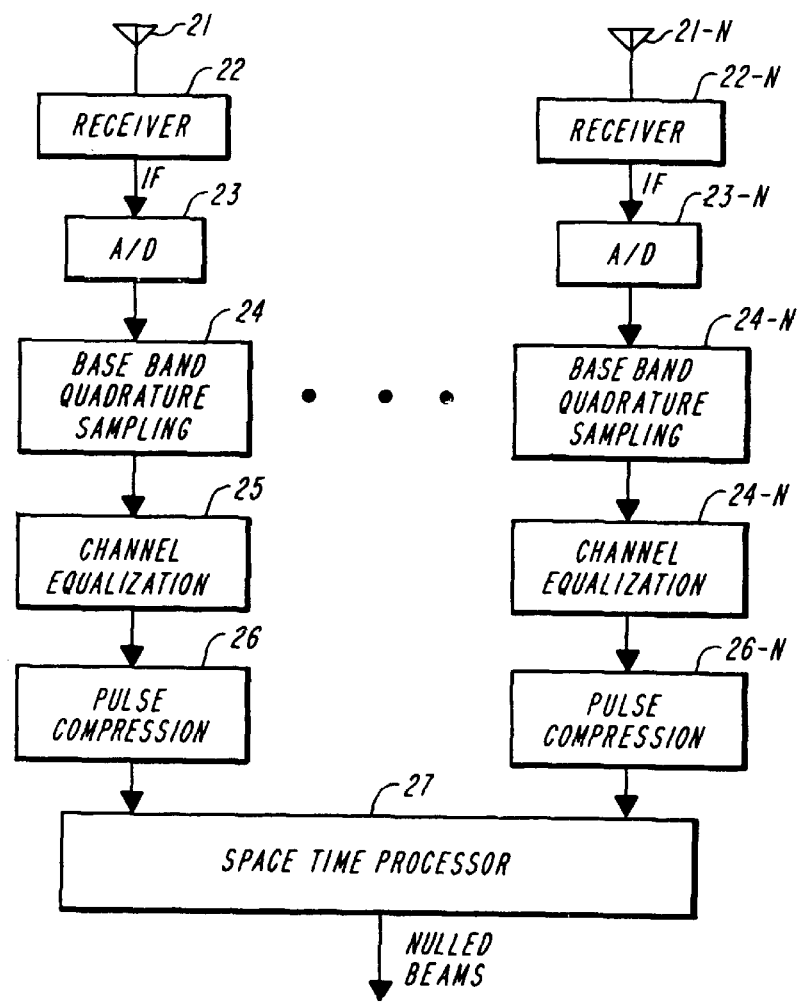
FIG. 2 shows a block diagram of an exemplary adaptive radar system.

With reference now to FIG. 2, there is shown an exemplary architecture of an adaptive radar system 20 which represents one example of system application for the present invention. The RF signal received by the antenna 21 is converted to IF signal by the receiver 22. The IF signal is converted by A/D converter 23, and then passed to a baseband quadrature sampler (BQS) module 24 which digitally generates in-phase (I) and quadrature (Q) parts from the A/D output. The I/Q pair is then channel equalized by channel equalizer 25, pulse compressed at pulse compressor 26, and provided to an adaptive processor such as space time adaptive processor (STAP processor) 27.

Figure 3:
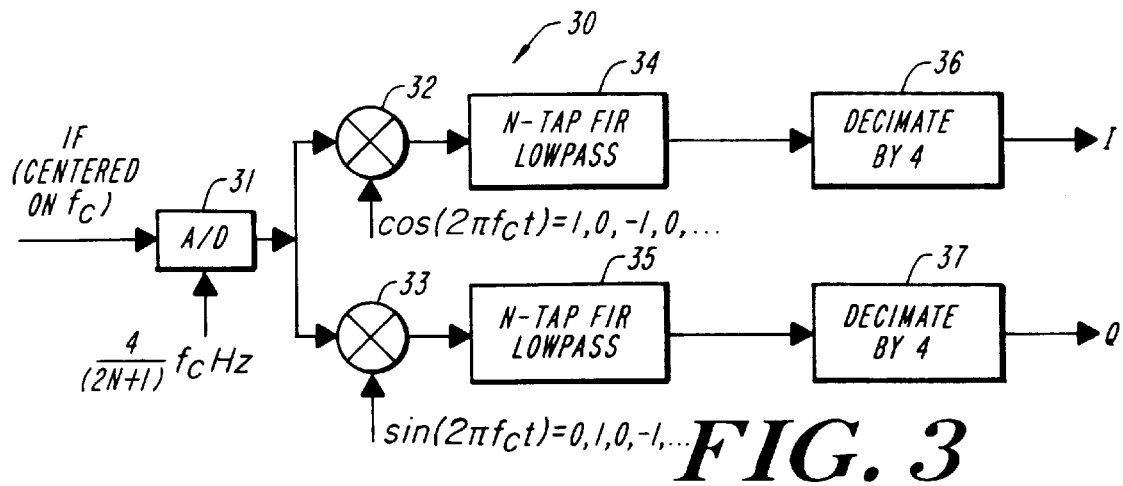
FIG. 3 shows an exemplary functional block diagram of a digital quadrature sampling system.

There are numerous alternative approaches for implementing the quadrature sampling technique. FIG. 3 shows an exemplary functional block diagram of a digital BQS in accordance with the present invention. The quadrature sampler 30 has one A/D converter and digital mixers 32, 33. The lowpass filtering is carried out digitally as well with finite impulse response (FIR) filters 34, 35. Assuming the A/D sampling rate $f_s$ is equal to $4/(2N+1)f_c$, i.e., the input IF signal is centered around $(2N+1)/4$ of the A/D sampling rate, then digital 1, 0 and −1 values can be used for the local oscillator signals $\cos 2\pi f_c t$ and $\sin 2\pi f_c t$. This configuration greatly simplifies the digital mixing operations to produce the baseband in-phase (I) and quadrature (Q) components. The digital N-tap FIR lowpass filters 34, 35 reject the signal beyond $\pm f_c/2$ in order to eliminate the negative frequency sideband and the DC component. The filter output is decimated by a factor of 4 by decimation circuits 36, 37 to produce the digital baseband signal (Nyquist output).

Figure 1:
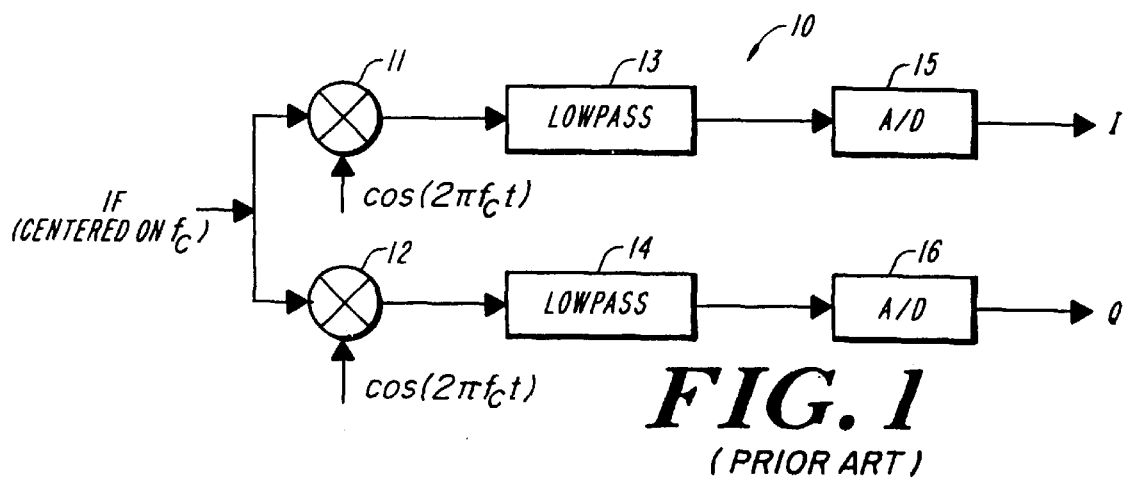
FIG. 1 shows a block diagram of a conventional quadrature sampler.

The quadrature sampler 10 in FIG. 1 requires that the inphase and quadrature channels be closely matched. The quadrature sampler 30 utilizing one A/D and digital mixing as in FIG. 3 eliminates the channel matching requirement. The disadvantage of the quadrature sampler in FIG. 3 is that it requires the A/D to run at four times the rate of the device shown in FIG. 1. However, as high speed A/D's are now readily available, this is becoming less significant.

Figure 4:
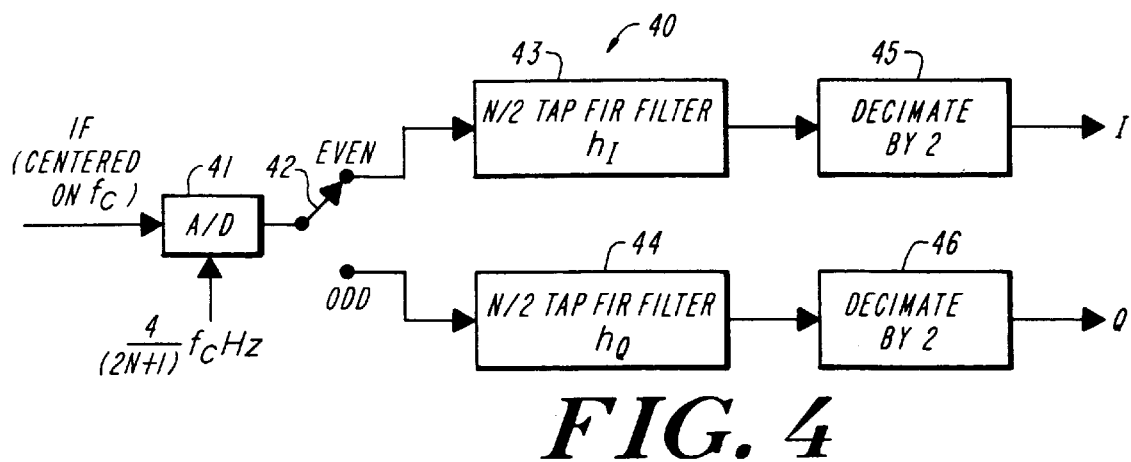
FIG. 4 shows an alternative exemplary functional block diagram of a digital quadrature sampling system.

When 1, 0 and −1 values are to be used for the mixing signals $\cos 2\pi f_c t$ and $\sin 2\pi f_c t$ in FIG. 3, half of the filter inputs are zeros. Accordingly, a quadrature sampling system 40 can be configured as shown in FIG. 4 for simplification. The system 40 includes A/D converter 41, a processor controlled switch 42, FIR filters 43, 44, and decimation circuits 45, 46. The h(n) is the original N-tap filter coefficients, and $h_I(n)$ and $h_Q(n)$ are N/2 tap filter coefficients related to h(n) by, for example:

$$h_I(n) = (-1)^{n+1} h(2n+1)$$

$$h_Q(n) = (-1)^{n+1} h(2n) \quad n = 0, 1, \ldots, (N/2)-1$$

It will be appreciated that since $h_I(n)$ and $h_Q(n)$ are followed by a decimation by a factor of two, half the filter outputs are discarded. The even numbered samples are switched to go to the $h_I(n)$ filter and the odd numbered samples go to the $h_Q(n)$ filter. The "odd" and "even" can be reversed in FIG. 4, and the system operates just as well. This quadrature sampling technique has half the computational requirement as the scheme shown in FIG. 3.

Figure 5:
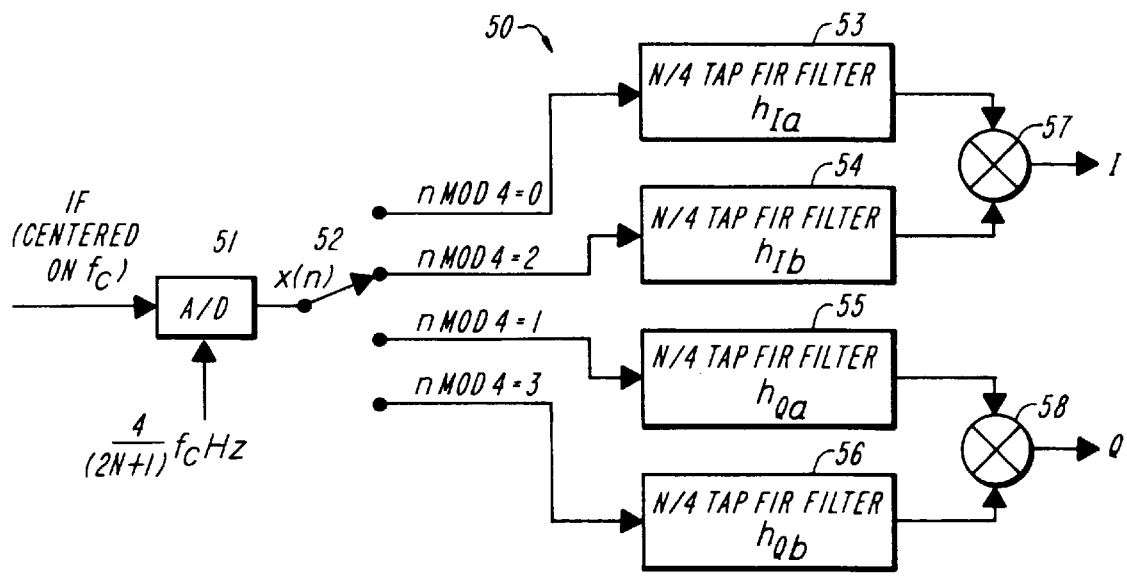
FIG. 5 shows an exemplary functional block diagram of a digital quadrature sampling system in accordance with the present invention.

FIG. 5 shows an exemplary embodiment of a quadrature sampling system 50 in accordance with the present invention which reduces the digital computation requirement by a factor of two compared to the scheme in FIG. 4. Since $h_I(n)$ and $h_Q(n)$ filters of FIG. 4 are followed by the decimation by a factor of two, 50% of the filter outputs are discarded. Assume now that only the even numbered points form the outputs I(n) and Q(n) are used. That means I(2n) and Q(2n) need to be computed but I(2n+1) and Q(2n+1) don't need to be computed, where $n = 0, 1, 2, \ldots, (N/4)-1$. The I(2n) and Q(2n) can be rewritten as $$I(2n) = \sum_{k=0}^{\frac{N}{2}-1} h_I(k) x_I(2n-k) \tag{1}$$

$$I(2n) = \tag{2}$$

$$\sum_{k=0}^{\frac{N}{4}-1} h_I(2k) x_I(2n-2k) + \sum_{k=0}^{\frac{N}{4}-1} h_I(2k+1) x_I(2n-2k-1)$$

$$Q(2n) = \sum_{k=0}^{\frac{N}{2}-1} h_Q(k) x_Q(2n-k) \tag{3}$$

$$Q(2n) = \tag{4}$$

$$\sum_{k=0}^{\frac{N}{4}-1} h_Q(2k) x_Q(2n-2k) + \sum_{k=0}^{\frac{N}{4}-1} h_Q(2k+1) x_Q(2n-2k-1)$$

where $x_I(n)$ and $X_Q(n)$ are the inputs to the filters $h_I(n)$ and $h_Q(n)$ respectively. The output of the A/D converter will be referred to as x(n). Notice that each of I(2n) and Q(2n) is equivalent to the sum of two FIR filter outputs whose throughput is half the rate. Using a polyphase filtering technique, further optimization can be made to result in the system as shown in FIG. 4. The inputs are alternately routed to the four filters whose coefficients are $$h_{Ia}(n) = h_I(2n+1)$$

$$h_{Ib}(n) = h_I(2n) \quad n = 0, 1, \ldots (N/4)-1$$

and $$h_{Qa}(n) = h_Q(2n+1)$$

$$h_{Qb}(n) = h_Q(2n) \quad n = 0, 1, \ldots (N/4)-1$$

Accordingly, the input x(n) from A/D converter 51 is alternately directed by processor controlled switch 52 to four different filters 53–56 as shown in FIG. 5. The two (N/2)-tap filters of FIG. 3 running at $2f_c$ Hz are now replaced by four (N/4)-tap filters running ¼ as fast, or at $f_c$ Hz. The total number of taps do not change from FIG. 4 to FIG. 5, but the filter throughput requirement decreases by a factor of two.

It will be appreciated that in the illustrated exemplary embodiment of FIG. 5, N is a multiple of 4. That makes all the filters in FIG. 5 symmetrical and easy to design. If N is not a factor of 4, h(n) can be padded with zero's to make it a multiple of 4 in length. In addition, a system using 2K number of (N/2K)-tap filters can easily be configured.

The cos and sin functions in FIG. 3 can have arbitrary initial phase. In a more general form, these functions would be written as $\cos(2\pi f_c t+\phi)$ and $\sin(2\pi f_c t+\phi)$, where $\phi$ is the initial phase value. There are four possible values of $\phi$ that allow the cos and sin functions to be 1, 0, and −1. These initial values are 0, $\pi/2$, $\pi$, and $3\pi/2$. Accordingly, this will set the stage for the possible sets of coefficients for the filters of FIG. 5.

The quadrature sampling system 50 of FIG. 5 accepts discrete sets of four input samples at a time and produces the corresponding output sample. An output sample consists of an I value and a Q value. It is important to ensure which four input samples are processed to produce an output sample. This is due to the fact that the additions by summation circuits 57, 58 in FIG. 5 have to be performed on correct filter outputs. The corresponding filter outputs are added to produce an output sample.

Once the set of filter coefficients are chosen, the four input samples, that are being processed to produce one output sample, should go to the filters in a predetermined order. There are various ways to group the input x(n) into sets for the four samples mentioned above. For example, in the input grouping, the first sample can be n(mod4)=0, n(mod4)=1, n(mod4)=2, or n(mod4)=3. Choosing which sample is the first of four input samples is equivalent to choosing which output values are kept after decimation in the scheme of FIG. 3. Once the first of four samples is chosen, the next input can be the second sample and so on. Therefore, the mapping of the input x(n) to the filters shown in FIG. 5 is only one of several possible mappings.

The critical advantage of the quadrature sampler 50 of FIG. 5 over the sampler 40 shown in FIG. 4 is that the sampler 50 has approximately half the computational requirement. Although the number of total taps used in FIR filters is the same, the proposed filter has half the throughput requirement on the filters. The reduced computational requirement can reduce the size, weight, power, and cost approximately by a factor of two while keeping the sampler size, weight, power, and cost requirement about the same as the conventional sampler.

Figure 6:
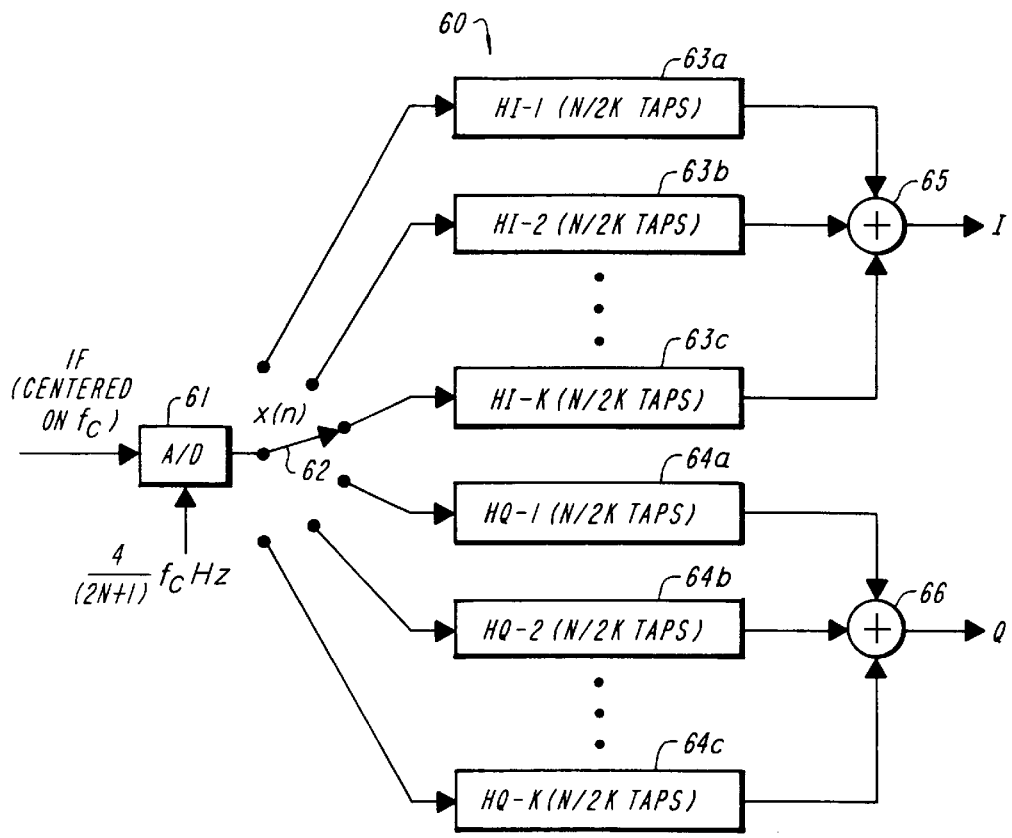
FIG. 6 shows an alternative exemplary functional block diagram of a digital quadrature sampling system in accordance with the present invention.

FIG. 6 shows an exemplary generalized embodiment of a quadrature sampling system 60 with a decimation factor of 2K in accordance with the present invention. Each filter bank 63, 64 includes K filters 63a–63c, 64a–64c with N/2K taps. The input x(n) from A/D 61 is alternatively routed by processor controlled switch 62 so that all 2K filters receive one input of the 2K consecutive input samples. The input x(n) is also routed so that the input sample alternates between the I set of K filters 63 and the Q set of filters 64. The computational savings over that of FIG. 3 is equal to a factor of 4K, while the computational savings over that of FIG. 4 is equal to a factor of K.

A very useful feature of the proposed quadrature sampler is that its computations are done mostly in FIR filters. The FIR filter computation can be very efficiently implemented in VLSI structures. It is also possible to implement FIR filter using Discrete Fourier Transform (DFT) or Fast Fourier Transform (FFT).

In some applications involving relatively low data rates, the quadrature sampler can be implemented mostly in software. Even in software implementation, the proposed quadrature sampler reduces the computation requirement by 50% over the conventional samplers.

Figure 7A:
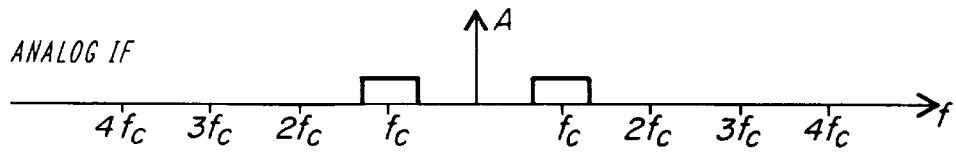
FIGS. 7A–7G show frequency domain graphs of the BQS process.
Figure 7B:
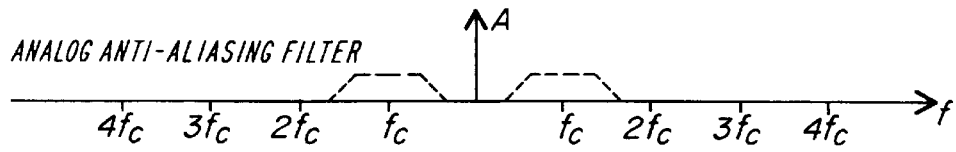

Now for illustrative purposes and assuming a radar application where $f_s=4f_c$, the following description pertains to the operation of the BQS of FIG. 3. FIGS. 7A–7G show the frequency domain illustration of the BQS process. FIG. 7A shows the frequency spectrum at the input of the A/D converter. FIG. 7B shows the frequency response of an analog anti-aliasing filter (not shown) which is coupled at the front end of the A/D converter. The exemplary 4:1 down-sampling BQS scheme has the advantage that the analog anti-aliasing filter does not require very sharp transition bands. The lenient transition band requirement makes it easier for the analog anti-aliasing filter to be very flat and well behaved in the passband and to also have the high stopband rejection. The well behaved filter response is easier to equalize, and the high stopband rejection increases the signal to noise ratio. The filter's passband can be extended slightly beyond the signal band to provide some safety margin to make sure that the filter response is well behaved at the signal band edges.

Figure 7C:
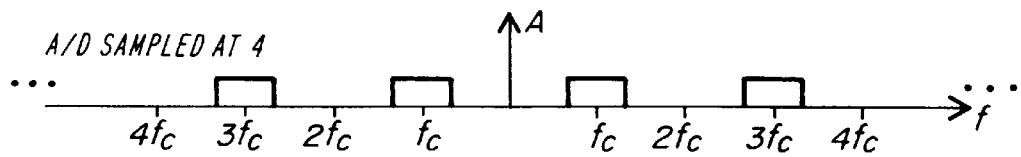
Figure 7D:
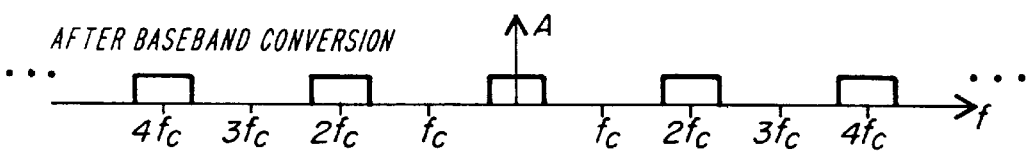
Figure 7E:
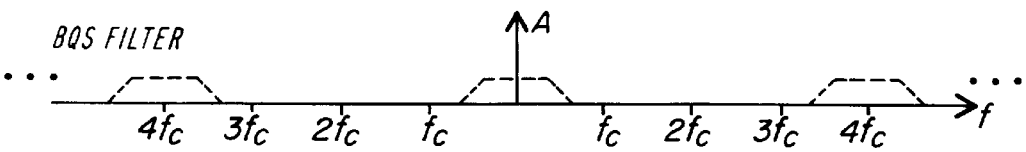
Figure 7F:
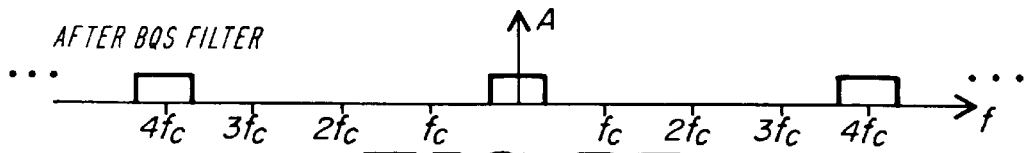

FIG. 7C shows the frequency spectrum at the output of the A/D converter. FIG. 7D is the frequency spectrum after the digital baseband conversion. FIG. 7E shows the frequency response of the BQS filter. FIG. 7F shows the frequency spectrum after BQS filtering, and FIG. 7G shows the frequency spectrum after decimation by 4:1.

Figure 8:
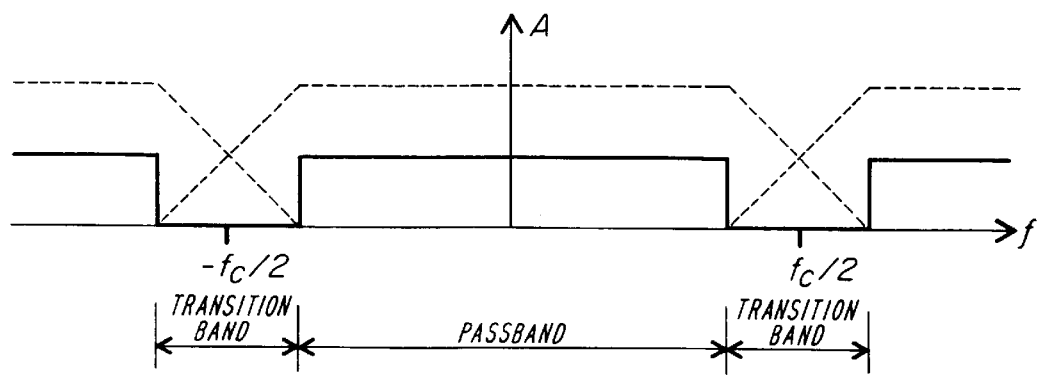
FIG. 8 shows enlarged versions of the output shown in FIG. 7G with the effect of BQS filter superimposed.
Figure 7G:
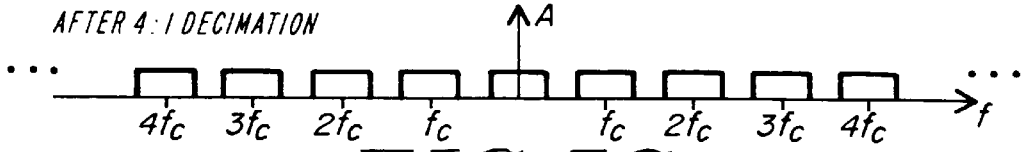

FIG. 8 shows enlarged versions of the output shown in FIG. 7G with the effect of BQS filter superimposed. The filter shape is plotted in dotted lines. Because the BQS filter is implemented digitally, the filter responses are identically matched in all the channels. In order to prevent aliasing into the passband, the filter gain should be sufficiently low at the ends of the transition bands. It will be appreciated that the transition band is from the passband edge to the passband edge, and not from the passband edge to Nyquist frequency of $f_c/2$. This is due to interest only in preventing aliasing into the passband.

The number of taps needed for the lowpass BQS FIR filter depends on the requirements on passband ripple, stopband rejection, and transition width. Generally, low passband ripple, high stopband rejection, and low transition width are desired. Also desired is low passband signal loss, which depends on the passband shape.

Although low passband ripple is generally desired in a BQS filter, it is usually not the limiting factor in, for example, applications involving radar performance. The passband ripples are exactly matched in all the channels because the BQS filters are implemented digitally. Therefore, the passband ripple does not effect the cancellation ratio. However, very large passband ripple will result in signal distortion. A reasonable practice is to keep the passband ripple below a few tenths of a dB.

The stopband rejection is more critical to the BQS filter operation. Insufficient stopband rejection causes aliasing. However, very high stopband rejection requires too many taps on the filter. How much stopband rejection is required depends very heavily on the system specifications.

The low transition width results in low I/Q output sampling rate. Reduced data rate reduces computational requirement in subsequent processing tasks such as channel equalization, pulse compression, adaptive nulling, etc. The lower transition width also results in lower A/D sampling rate, since the A/D sampling rate is equal to four times the I/Q sampling rate. However, making transition width very small requires many filter taps, and one has to make tradeoffs between transition width and hardware complexity.

One can also reduce the number of filter taps without increasing I/Q sampling rate by accepting some passband signal loss. For example, the passband edge can be defined as the 3dB point of the filter instead of having all of the passband within the passband ripple. In general, the filter design has to make proper tradeoffs between passband ripple, stopband rejection, transition width, passband signal loss, and hardware complexity.

Figure 9:
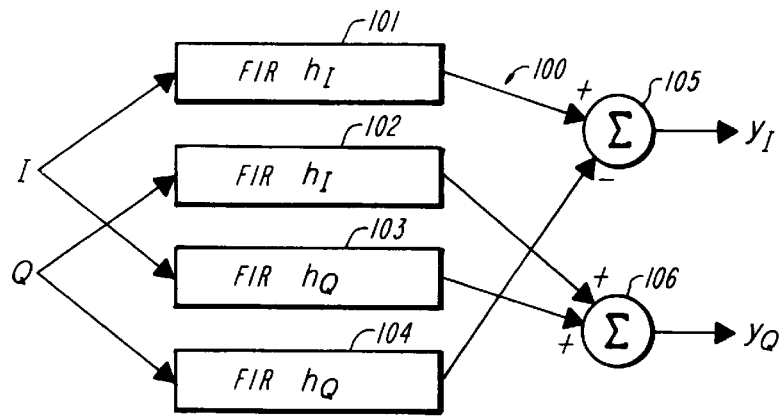
FIG. 9 shows an exemplary functional block diagram of a complex FIR filter.

The channel equalization (EQ) of the I and Q components requires a complex FIR filter configuration with programmable coefficients. FIG. 9 shows an exemplary complex FIR filter 100 which is implemented using four FIRs 101–104 with their outputs combined with summation circuits 105, 106 as shown in FIG. 8. Two of the integer filters 101, 102 contain the in-phase part of coefficients and the other two filters 103, 104 contain the quadrature coefficients.

For example, in conventional UHF radar applications, the channel equalization filter equalizes channel responses of the receiver and an A/D converter. A test signal is injected at the front of the receiver and the A/D output data is used to compute the equalization coefficients. The equalization filter equalizes everything in the injection path including filters, circulators, amplifiers, connectors, cables, A/D, etc.

Normally, the most critical element to be equalized is the anti-aliasing filter. The reason being that the anti-aliasing filter has relatively sharp frequency cutoff characteristics. In the process of achieving sharp cutoff characteristics, the anti-aliasing filter can end up with a significant channel mismatch. Other components generally have relatively flat frequency response around the passband and do not cause as significant mismatches. Therefore, how many taps are needed for channel equalization depends on what kind of analog filter is used as the anti-aliasing filter.

Figure 10:
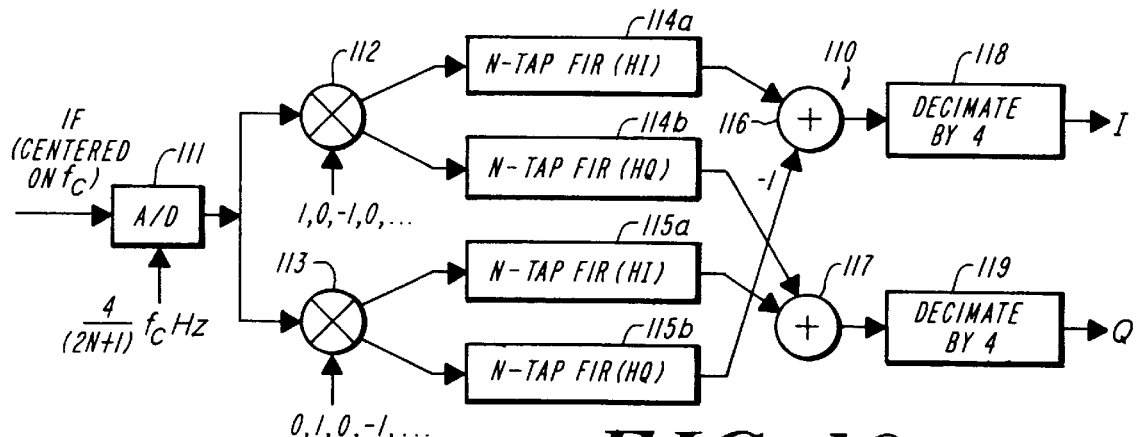
FIG. 10 shows an exemplary functional block diagram of a hybrid BQS/EQ system in accordance with the present invention.

It is possible to combine BQS and EQ filters into one hybrid complex FIR filter. Accordingly, an efficient hybrid filter architecture, which reduces the computational requirement by several fold, is described hereinafter. The functional block diagram of an exemplary hybrid BQS/EQ system 110 is shown in FIG. 10. The input IF signal, which is centered around (2N+1)/4 of the A/D sampling rate, is sampled by an A/D converter 111. The sampled data is then digitally mixed to produce the baseband in-phase and quadrature components by respective digital mixers 112, 113. The I/Q signals are then N-tap complex FIR filtered with FIRs 114a, 114b, 115a, 115b to eliminate the negative frequency sideband and the DC component as well as to equalize the passband response. The filter outputs are then decimated by a factor of 4 by decimation circuits 118, 119 to produce the equalized digital baseband signal.

Four N-tap FIR filters are used to implement one N-tap complex FIR filter.

Figure 11:
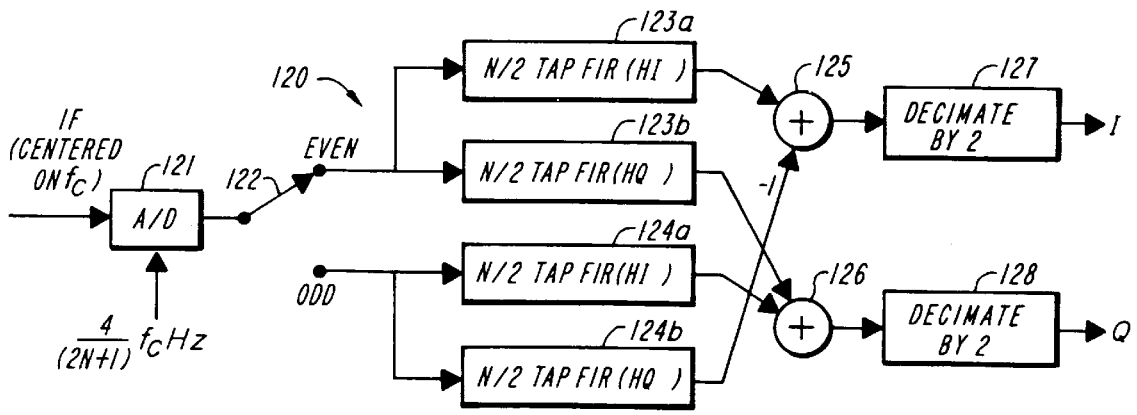
FIG. 11 shows an alternative exemplary functional block diagram of a hybrid BQS/EQ system in accordance with the present invention.

Since half the filter inputs in FIG. 10 are zeroes, a simplification of the system is shown by exemplary system 120 in FIG. 11. The system 120 includes an A/D converter 121, a processor controlled switch 122 for switching odd and even values between the FIR filters 123a, 123b, 124a, 124b, summation circuits 125, 126, and decimation circuits 127, 128. The $h_I(n)$ and $h_Q(n)$ are the original N-tap filter coefficients. The $h_{Ia}(n)$ $h_{Ib}(n)$ $h_{Qa}(n)$ and $h_{Qb}(n)$ are the N/2 tap filter coefficients related to $h_I(n)$ and $h_Q(n)$ by, for example:

$$h_{Ia}(n)=(-1)^{n+1}h_I(2n+1)$$

$$h_{Ib}(n)=(-1)^{n+1}h_I(2n)$$

$$h_{Qa}(n)=(-1)^{n+1}h_Q(2n+1)$$

$$h_{Qb}(n)=(-1)^{n+1}h_Q(2n) \; n=0,1,\ldots,(N/2)-1$$

Figure 12:
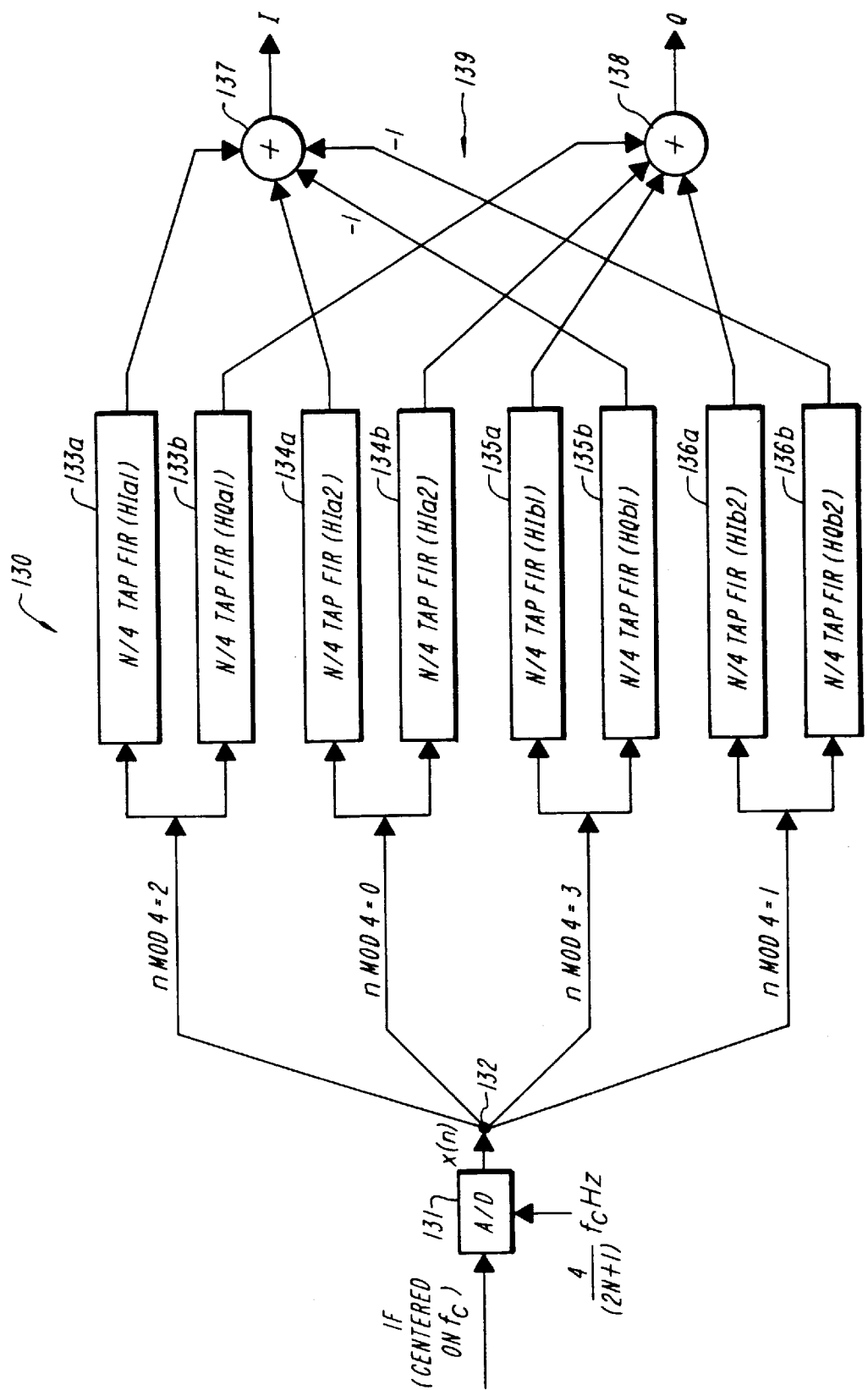
FIG. 12 shows another alternative exemplary functional block diagram of a hybrid BQS/EQ system in accordance with the present invention.

At this point, it will be appreciated that since $h_I(n)$ and $h_Q(n)$ are followed by a decimation by a factor of two, half of the filter outputs are discarded. Using a polyphase filtering technique, further optimization can be made to configure an exemplary hybrid BQS/EQ system 130 in accordance with the present invention as is shown in FIG. 12. The discrete sets of inputs from A/D converter 131 are alternately routed by processor controlled switch 132 to the eight filters 133a–b, 134a–b, 135a–b, 136a–b, whose respective coefficients are, for example:

$$h_{Ia1}(n)=h_{Ia}(2n)$$

$$h_{Ia2}(n)=h_{Ia}(2n+1)$$

$$h_{Ib1}(n)=h_{Ib}(2n)$$

$$h_{Ib2}(n)=h_{Ib}(2n+1)$$

$$h_{Qa1}(n)=h_{Qa}(2n)$$

$$h_{Qa2}(n)=h_{Qa}(2n+1)$$

$$h_{Qa1}(n)=h_{Qb}(2n)$$

$$h_{Qa2}(n)=h_{Qb}(2n+1) \; n=0, 1, \ldots, (N/4)-1$$

The four N-tap filters in FIG. 10 are now replaced by eight (N/4)-tap filters running ¼ as fast. The outputs of the filters are alternately applied to summation circuits 137, 138 to produce the I and Q components. For example, with consecutive mapping values n mod4=2, n mod4=0, n mod4=3, and n mod4=1, the output is switched such that the upper filter bank has the outputs from the FIRs with an I coefficient applied to the I summation circuit 137, and the outputs from the FIRs with a Q coefficient are applied to the Q summation circuit 138. The lower filter bank alternates such that the outputs from the FIRs with the I coefficient are applied to the Q summation circuit, and the negative value of the outputs from the filters with the Q coefficient are applied to the I summation circuit. It will be appreciated by those skilled in the art that other switching schemes are possible.

The total number of taps do not change from FIG. 11 to FIG. 12, but the filter throughput requirement decreases by a factor of two. Overall, the computational requirements required is reduced by a factor of eight from FIG. 10 to FIG. 12.

Figure 13:
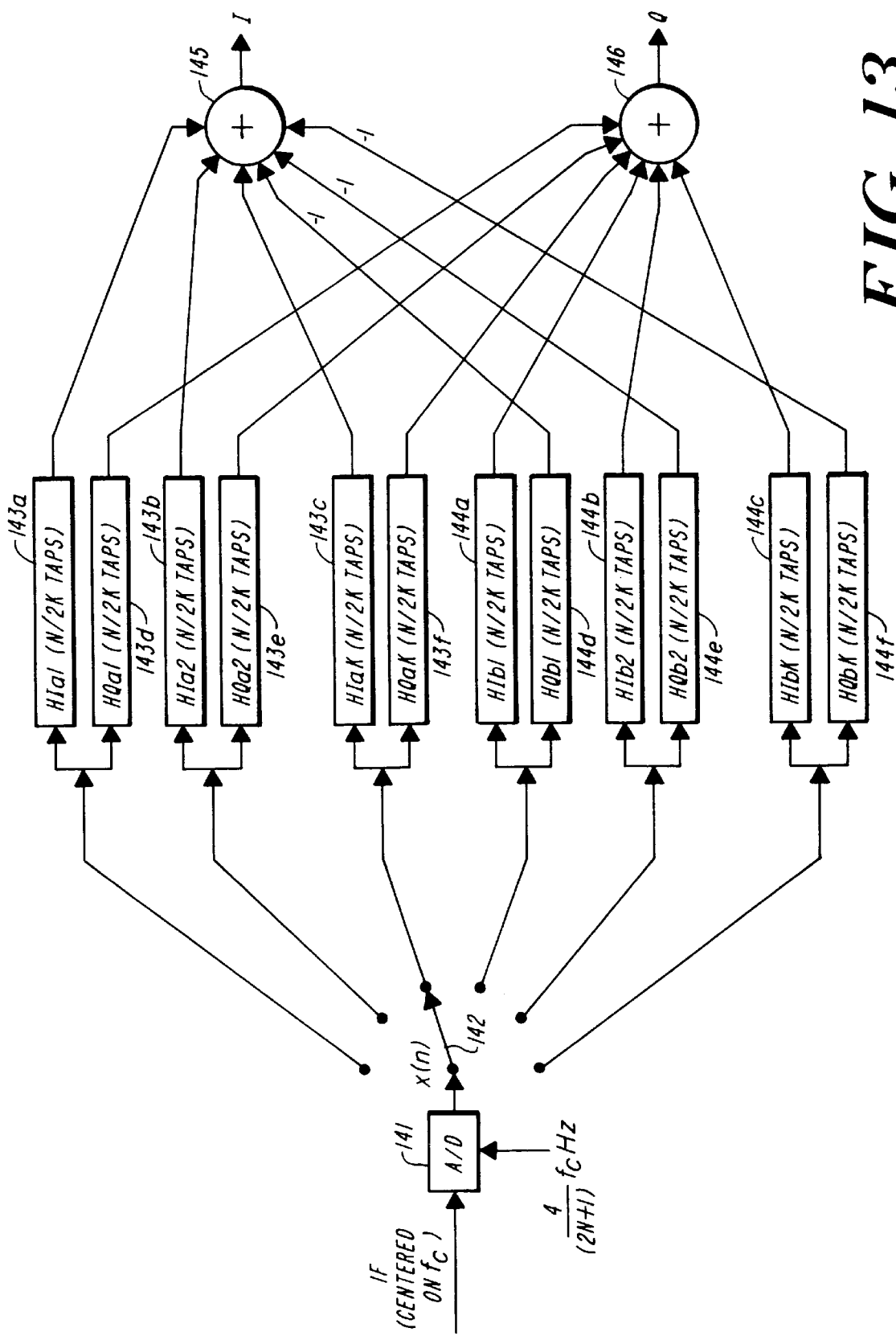
FIG. 13 shows yet another alternative exemplary functional block diagram of a hybrid BQS/EQ system in accordance with the present invention.

FIG. 13 shows another alternative embodiment of an exemplary generalized hybrid BQS/EQ system 140 with a decimation factor of 2K in accordance with the present invention. Each filter bank 143, 144 includes K I filters 143a–c, 144a–c and K Q filters 143d–f, 144d–f, each with N/2K taps. The input x(n) from A/D 141 is alternatively routed by processor controlled switch 142 so that all 4K filters receive one input of the 2K consecutive input samples. The input x(n) is also routed so that two of the filters receive identical input, and so that the input sample alternates between the upper bank of K filters 143 and the lower bank of filters 144. The computational savings over that of FIG. 10 is equal to a factor of 4K, while the computational savings over that of FIG. 11 is equal to a factor of K.

In comparing the efficiency of the separate BQS/EQ filters versus the efficiency of the hybrid filter in a case where k=2, a system with N BQS taps and M EQ taps will be considered. Most of the degrees of freedom in the BQS filter are used to reject the stopband. Therefore, the equivalent hybrid filter would need approximately N taps for stopband attenuation. For the EQ filter, most of the degrees of freedom can be made to equalize the passband by appropriate weighting. Therefore, the equivalent hybrid filter would need approximately M taps for passband equalization. Therefore, the equivalent hybrid filter would need N+M total taps. A system with N-tap BQS filter and M-tap EQ filter needs N+4M real taps running at the I/Q sampling rate. An equivalent hybrid filter with N+M complex taps needs 2(N+M) real taps running at the I/Q sampling rate. Therefore, if the BQS tap-count is much larger than the EQ tap-count, the separate filter approach is more efficient. However, if the EQ tap-count is much larger than the BQS tap-count, then the hybrid filter approach is more efficient. When the BQS filter tap-count is approximately twice the EQ filter tap-count (N=2M), the separate and hybrid approaches would be comparable.

However, the hybrid filter will probably perform slightly better than the separate filters when N=2M. This is because several degrees of freedom in the BQS filter were used on the passband even though most of the degrees of freedom were used in the stopband. These several degrees of freedom do not perform passband equalization or stopband rejection. Therefore, the hybrid filter may use these several extra degrees of freedom for additional stopband attenuation and/or passband equalization. Whether the hybrid filter actually performs better needs to be verified by experiments. In addition, computing the hybrid filter coefficients requires more computation than computing the EQ filter coefficients, since the EQ filter has much fewer taps.

The foregoing description has been set forth to illustrate the invention and is not intended to be limiting. Since modifications of the described embodiments incorporating the spirit and substance of the invention may occur to persons skilled in the art, the scope of the invention should be limited solely with reference to the appended claims and equivalents thereof.

What is claimed is:

1. A quadrature sampling system which converts input signals to baseband inphase and quadrature signal components, said system comprising:

a signal receiver which receives said input signal having a frequency centered around a predetermined carrier frequency;

a signal processor which continuously samples said input signal at a ratio of said carrier frequency to produce discrete sequences of 2K input samples, where K is an integer;

an inphase signal channel including a first set of K filters each having respective filter coefficients, said first set of filters arranged to receive said discrete sequences, and a first signal summer which sums the outputs of said first set of K filters to produce said inphase signal component;

a quadrature signal channel including a second set of K filters each having respective filter coefficients, said second set of filters arranged to receive said discrete sequences, and a second signal summer which sums the outputs of said second set of K filters to produce said quadrature signal component; and means for providing said input samples to said inphase and quadrature signal channels so that each filter of both channels receives one input sample of each sequence.

2. The system of claim 1, wherein said signal processor comprises an analog-to-digital converter which generates digital input samples.

3. The system of claim 1, wherein said signal processor continuously samples said input signal at a sampling frequency of $4/(2N+1)$ of said carrier frequency, where N is an integer.

4. The system of claim 1, wherein each of said filters comprises $N/2K$ taps, where N is an integer.

5. The system of claim 1, wherein said providing means operates to alternately switch said input samples of each sequence between said inphase and quadrature signal channels.

6. A method of quadrature sampling by converting input signals to baseband inphase and quadrature signal components, said method comprising:

receiving said input signal having a frequency centered around a predetermined carrier frequency;

continuously sampling said input signal at a ratio of said carrier frequency and producing discrete sequences of 2K input samples, where K is an integer;

applying selected portions of said discrete sequences at an inphase signal channel including a first set of K filters each having respective filter coefficients, said first set of filters arranged to receive said discrete sequences;

summing the outputs of said first set of K filters to produce said inphase signal component;

applying selected portions of said discrete sequences to a quadrature signal channel including a second set of K filters each having respective filter coefficients, said second set of filters arranged to receive said discrete sequences;

summing the outputs of said second set of K filters to produce said quadrature signal component; and alternately providing said input samples of each sequence between said inphase and quadrature signal channels and for applying alternate ones of the input samples to a selected one of said filters for each channel so that each filter receives one input sample of each sequence.

7. A hybrid quadrature sampling and channel equalization system which converts input signals to equalized baseband inphase and quadrature signal components, said system comprising:

a receiver which receives said input signal having a frequency centered around a predetermined carrier frequency;

a signal processor which continuously samples said input signal at a ratio of said carrier frequency to produce discrete sequences of 2K input samples, where K is an integer;

first and second sets of K signal processing filter pairs, each filter pair including an inphase filter having an inphase filter coefficient and a quadrature filter having a quadrature filter coefficient, said first and second set of filter pairs arranged to receive said discrete sequences;

means for alternately switching said input samples between said first and second sets of K signal processing filter pairs and for applying selected ones of the input samples to each filter pair so that each filter pair receives one input sample of each sequence;

an inphase signal summer which sums the outputs of selected filters from each of said signal processing filter pairs to produce said inphase signal component;

a quadrature signal summer which sums the outputs of selected filters from each of said signal processing filter sets to produce said inphase signal component; and means for selectively providing the outputs of each of said filters of said first and second sets to said inphase and quadrature signal summers.

8. The system of claim 7, wherein said signal processor comprises an analog-to-digital converter which generates digital input samples.

9. The system of claim 7, wherein said signal processor continuously samples said input signal at a sampling frequency of $4/(2N+1)$ of said carrier frequency, where N is an integer.

10. The system of claim 7, wherein each of said filters comprises $N/2K$ taps, where N is an integer.

11. The system of claim 7, wherein said selective providing means operates to provide the outputs of the inphase filters of said first filter pair set to said inphase signal summer and the outputs of quadrature filters of said first set to said quadrature signal summer.

12. The system of claim 11, wherein said selective providing means further operates to provide the negative value of the outputs of the inphase filters of said second filter pair set to said quadrature signal summer and the outputs of quadrature filters of said second set to said inphase signal summer.

13. A method of quadrature sampling and channel equalization for converting input signals to equalized baseband inphase and quadrature signal components, said method comprising:

receiving said input signal having a frequency centered around a predetermined carrier frequency;

continuously sampling said input signal at a ratio of said carrier frequency and producing discrete sequences of 2K input samples, where K is an integer;

alternately switching said input samples between first and second sets of K signal processing filter pairs, each filter pair including an inphase filter having an inphase filter coefficient and a quadrature filter having a quadrature filter coefficient, said first and second set of filters arranged to receive said discrete sequences;

applying selected ones of the input samples to each filter pair so that each filter pair receives one digital input sample of each sequence;

selectively providing the outputs of said filter pairs of said first and second sets to inphase and quadrature signal summers; and summing the outputs of selected filters from each of said signal processing filter pairs to produce said inphase signal component, and summing the outputs of selected filters from each of said signal processing filter sets to produce said inphase signal component.

\* \* \* \* \*